United States Patent
Ueda et al.

(10) Patent No.: US 10,424,897 B2
(45) Date of Patent: Sep. 24, 2019

(54) SEMICONDUCTOR LASER DEVICE AND METHOD FOR MANUFACTURING SAME

(71) Applicant: Panasonic Intellectual Property Management Co., Ltd., Osaka (JP)

(72) Inventors: Naoto Ueda, Hyogo (JP); Kouji Oomori, Shiga (JP); Takayuki Yoshida, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/071,987

(22) PCT Filed: Feb. 27, 2017

(86) PCT No.: PCT/JP2017/007275
§ 371 (c)(1),
(2) Date: Jul. 23, 2018

(87) PCT Pub. No.: WO2017/183300
PCT Pub. Date: Oct. 26, 2017

(65) Prior Publication Data
US 2019/0036300 A1 Jan. 31, 2019

(30) Foreign Application Priority Data
Apr. 19, 2016 (JP) .................. 2016-083285

(51) Int. Cl.
*H01S 5/024* (2006.01)
*H01S 5/022* (2006.01)
(Continued)

(52) U.S. Cl.
CPC .......... *H01S 5/02423* (2013.01); *H01S 5/026* (2013.01); *H01S 5/02236* (2013.01);
(Continued)

(58) Field of Classification Search
CPC . H01S 5/02423; H01S 5/02236; H01S 5/0425
See application file for complete search history.

(56) References Cited

U.S. PATENT DOCUMENTS

2006/0227827 A1* 10/2006 Kawanishi .......... H01S 5/02423
372/36
2015/0023376 A1 1/2015 Yamanaka et al.

FOREIGN PATENT DOCUMENTS

EP 1 253 685 10/2002
JP 2006-54277 2/2006
(Continued)

OTHER PUBLICATIONS

International Search Report dated Mar. 21, 2017 in International (PCT) Application No. PCT/JP2017/007275.

*Primary Examiner* — Michael Carter
(74) *Attorney, Agent, or Firm* — Wenderoth, Lind & Ponack, L.L.P.

(57) ABSTRACT

A semiconductor laser device includes a heat sink, a submount, a first electrode, an insulating layer, a semiconductor laser element, a connecting portion, and a second electrode. The submount is conductive and on a first region of an upper surface of the heat sink. The first electrode is conductive and on a second region, different from the first region, of the upper surface of the heat sink. The first electrode is electrically connected either to at least part of a side surface of the submount or to an upper surface of the submount.

9 Claims, 5 Drawing Sheets

(51) Int. Cl.
*H01S 5/026* (2006.01)
*H01S 5/042* (2006.01)
*H01S 5/40* (2006.01)

(52) U.S. Cl.
CPC ........ *H01S 5/02469* (2013.01); *H01S 5/0425* (2013.01); *H01S 5/02264* (2013.01); *H01S 5/02272* (2013.01); *H01S 5/02276* (2013.01); *H01S 5/02492* (2013.01); *H01S 5/4025* (2013.01)

(56) References Cited

FOREIGN PATENT DOCUMENTS

| | | |
|---|---|---|
| JP | 2006-294943 | 10/2006 |
| JP | 2008-172141 | 7/2008 |
| JP | 2009-9991 | 1/2009 |
| WO | 02/35666 | 5/2002 |
| WO | 2013/128794 | 9/2013 |

* cited by examiner

SEMICONDUCTOR LASER DEVICE AND METHOD FOR MANUFACTURING SAME

TECHNICAL FIELD

The present disclosure relates to a semiconductor laser device and a method for manufacturing the device. In particular, the disclosure relates to a semiconductor laser device equipped with a high-output semiconductor laser element on its heat sink, and a method for manufacturing such a semiconductor laser device.

BACKGROUND ART

With the recent increasing demand for laser metalworking, semiconductor laser devices are required to have higher output.

Figure 15:
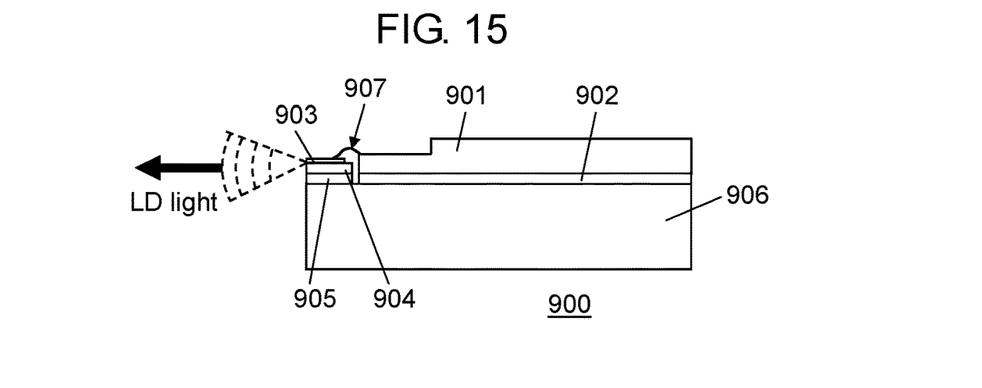
FIG. 15 is a schematic configuration view of laser diode 900 known in the art.

FIG. 15 is a schematic configuration view of laser diode 900 known in the art. As shown in FIG. 15, laser diode 900 includes upper electrode 901, insulating member 902, LD chip 903, submounts 904 and 905, heat sink 906, and wire 907. Heat sink 906 is mounted with a laminated body of upper electrode 901 and insulating member 902, and a laminated body of LD chip 903 and submounts 904 and 905.

The upper surface of LD chip 903 is joined to upper electrode 901 (negative electrode) via wire 907. The lower surface of LD chip 903 is joined to a positive electrode (not shown) via submounts 904 and 905. Heat sink 906 includes a flow channel for cooling water to improve cooling efficiency (see, e.g., Japanese Unexamined Patent Application Publication No. 2008-172141).

In laser diode 900 known in the art, the current path for the negative electrode is wire 907, while the current path for the positive electrode is not clearly described. Thus, when laser diode 900 has current paths with high electrical resistance, LD chip 903 is supplied with only a limited current, failing to achieve high laser output.

SUMMARY OF THE INVENTION

An object of the present disclosure is to provide a semiconductor laser device that enables the semiconductor laser element to be supplied with a large current by greatly reducing the electrical resistance of the current paths, thereby achieving a high laser output, and a method for manufacturing such a semiconductor laser device.

To solve the above problems, the semiconductor laser device according to the present disclosure includes a heat sink, a submount, a first electrode, an insulating layer, a semiconductor laser element, a connecting portion, and a second electrode. The heat sink is insulating and includes a flow channel for a coolant. The submount is conductive and on a first region of the upper surface of the heat sink. The first electrode is conductive and on a second region, different from the first region, of the upper surface of the heat sink. The insulating layer is on the first electrode. The semiconductor laser element for outputting laser light is on a third region of the upper surface of the submount. The connecting portion is conductive and on the semiconductor laser element. The second electrode is conductive and on the insulating layer and the connecting portion. The first electrode is electrically connected either to at least part of a side surface of the submount or to a fourth region, different from the third region, of the upper surface of the submount.

The method for manufacturing a semiconductor laser device according to the present disclosure includes first to sixth steps. The first step puts a conductive submount onto a first region of the upper surface of an insulating heat sink including a flow channel for a coolant. The second step puts a conductive first electrode onto a second region, different from the first region, of the upper surface of the heat sink. The third step puts an insulating layer onto the first electrode. The fourth step puts a semiconductor laser element, which is configured to output laser light, onto a third region of the upper surface of the submount. The fifth step puts a conductive connecting portion onto the semiconductor laser element. The sixth step puts a conductive second electrode onto the insulating layer and the connecting portion. In the second step, the first electrode is electrically connected either to at least part of a side surface of the submount or to a fourth region, different from the third region, of the upper surface of the submount.

The semiconductor laser device and the method for manufacturing the device according to the present disclosure enable the semiconductor laser element to be supplied with a large current by greatly reducing the electrical resistance of the current paths, thereby achieving a high-power laser output.

DESCRIPTION OF EMBODIMENT

Exemplary Embodiment

The exemplary embodiment will now be described with reference to FIGS. 1 to 4. FIGS. 1, 2, 3 and 4 are schematic sectional views of semiconductor laser devices 1, 2, 3 and 4, respectively, according to the present exemplary embodiment.

Figure 1:
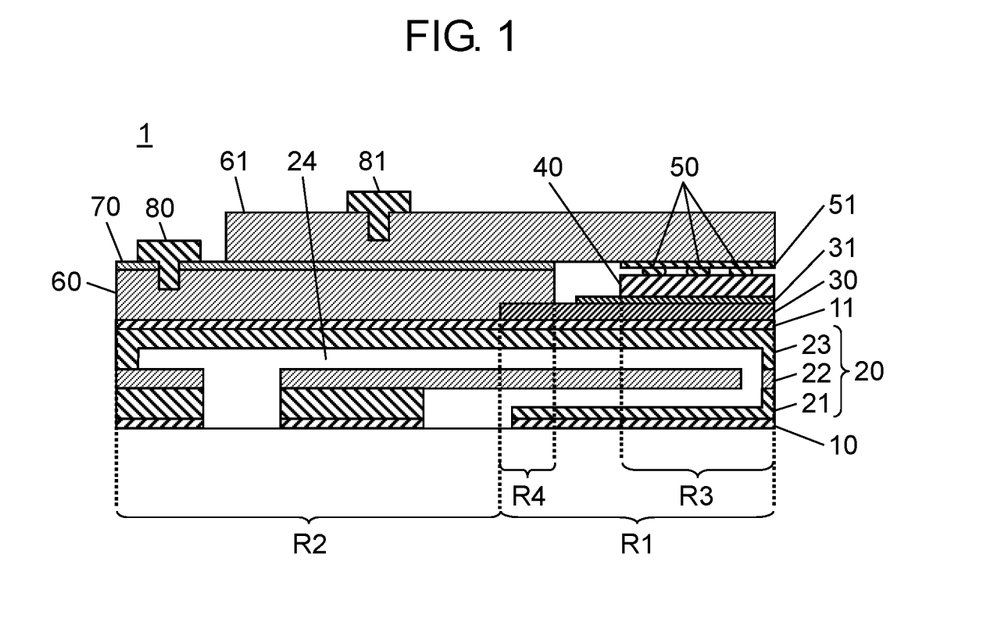
FIG. 1 is a schematic sectional view of semiconductor laser device 1 according to an exemplary embodiment.

As shown in FIG. 1, semiconductor laser device 1 includes heat sink 20, submount 30, first electrode 60, insulating layer 70, semiconductor laser element 40, connecting portions 50, and second electrode 61. Heat sink 20 is insulating and includes flow channel 24 for a coolant. Submount 30 is conductive and on a first region R1 of the upper surface of heat sink 20. First electrode 60 is conductive and on a second region R2, different from the first region R1, of the upper surface of heat sink 20. Insulating layer 70 is on first electrode 60. Semiconductor laser element 40 for outputting laser light is on a third region R3 of the upper surface of submount 30. Connecting portions 50 are conductive and on semiconductor laser element 40. Second electrode 61 is conductive and on insulating layer 70 and connecting portions 50. First electrode 60 is electrically connected either to at least part of a side surface of submount 30 or to a fourth region R4, different from the third region R3, of the upper surface of submount 30.

Next, each component of device 1 will be described specifically. If not otherwise specified, the relative positions of the components are defined as follows. Submount 30 and first electrode 60 are located above heat sink 20. Submount 30 is located on the right of first electrode 60. The upward and right directions in the drawings are perpendicular to the front-back direction. Note that these relative positions are used only for convenience of explanation and do not specify the orientation of the semiconductor laser devices when in use.

Heat sink 20 includes insulating plates 21, 22, and 23 combined together to define flow channel 24 for a coolant. Insulating plates 21-23 are made, for example, of aluminum nitride (AlN). Aluminum nitride has high thermal conductivity and allows heat sink 20 to efficiently release the heat from semiconductor laser element 40. Heat sink 20, when made of aluminum nitride, has a similar thermal expansion coefficient to semiconductor laser element 40 and also has excellent corrosion resistance. Furthermore, heat sink 20 has copper (Cu) layer 10 on its lower surface and copper (Cu) layer 11 (first conductive layer) on its upper surface. Copper layer 11 makes first electrode 60 and submount 30 joined to heat sink 20. In other words, first electrode 60 and submount 30 are in direct contact with copper layer 11. Instead of aluminum nitride, heat sink 20 can be made of any other material that is insulating and that has high thermal conductivity and corrosion resistance and a similar thermal expansion coefficient to semiconductor laser element 40. Copper layers 10 and 11 are not essential components of device 1; copper layer 11 could be replaced by another material with high thermal conductivity. Alternatively, first electrode 60 and submount 30 can be directly connected to heat sink 20 without providing copper layer 11.

Submount 30, which is made, for example, of copper-tungsten (CuW), is coupled to the first region R1 of heat sink 20 via copper layer 11. Submount 30 includes gold-tin (AuSn) layer 31 (second conductive layer) deposited on its upper surface. Layer 31 is larger than third region R3 having semiconductor laser element 40 on it. Layer 31 allows semiconductor laser element 40 to be coupled to submount 30. In other words, element 40 is in direct contact with layer 31. Instead of copper-tungsten, submount 30 can be made of any other material that is conductive and has high thermal conductivity and thermal expansion coefficient adjusted to reduce distortion to semiconductor laser element 40 after coupling. Gold-tin layer 31 is not an essential component of device 1 and may be replaced by any other material that is conductive and has high thermal conductivity. Alternatively, semiconductor laser element 40 can be directly coupled to submount 30 without providing layer 31.

Semiconductor layer element 40 is coupled to the third region R3 of submount 30 via gold-tin layer 31. Element 40 has a positive electrode (+) as its lower surface and a negative electrode (−) as its upper surface in the exemplary embodiment; however, these polarities can be reversed. Semiconductor laser element 40 is supplied with current and outputs laser light. In FIG. 1, element 40 emits laser radiation rightward from its right end. The laser output from element 40 increases with increasing amount of current flowing into element 40, and the heat from element 40 also increases accordingly. At high temperatures, semiconductor laser element 40 would decrease the laser output or cause damage to semiconductor laser device 1. To avoid this, element 40 needs to be cooled by heat sink 20 and other components. Element 40 may have only one emitting region or may be a laser bar including a plurality of emitting regions arranged in the front-back direction.

Connecting portions 50 are on semiconductor laser element 40 and connected to the negative electrode of the upper surface of element 40. Portions 50 are gold bumps made, for example, by melting gold (Au) wire. Gold, which is softer than many other metals, allows connecting portions 50 to deform when element 40 and second electrode 61 are connected together. As a result, excellent electric connection is established between element 40 and second electrode 61. Instead of gold, connecting portions 50 can be made of any other conductive material that can ensure the electric connection between the upper surface of element 40 and second electrode 61. It is also possible to provide gold foil 51 (third conductive layer) between connecting portions 50 and second electrode 61 as shown in FIG. 1. In other words, connecting portions 50 and second electrode 61 are in direct contact with gold foil 51, thereby improving the electric connection between portions 50 and second electrode 61. Gold foil 51 could be replaced by other conductive materials. Still alternatively, two or more gold foils 51 could be put between connecting portions 50 and second electrode 61. It is also possible not to provide gold foil 51.

At least part of first electrode 60 is coupled to the second region R2 of heat sink 20 via copper layer 11. First electrode 60 can be made, for example, of copper (Cu). Insulating layer 70, which is on the upper surface of first electrode 60, ensures the insulation between first electrode 60 and second electrode 61. Instead of copper, first electrode 60 can be made of any conductive material.

As shown in FIG. 1, first electrode 60 is in direct contact with part of a side surface of submount 30 and with the fourth region R4, different from the third region R3, of the upper surface of submount 30. This arrangement can greatly reduce the electric connection resistance between first electrode 60 and the positive electrode of semiconductor laser element 40, thereby supplying a large current to element 40. The term "in direct contact" used between first electrode 60 and submount 30 indicates that they are either in direct contact with each other as shown in FIG. 1 or in contact with each other via a thin conductive layer or film (not shown).

Thus, first electrode 60 is electrically connected to the positive electrode, which is the lower surface of semiconductor laser element 40.

Second electrode 61 is on connecting portions 50 and insulating layer 70 and electrically connected to connecting portions 50. Second electrode 61 is in contact with connecting portions 50 via gold foil 51 in the exemplary embodiment, but may alternatively be in direct contact with connecting portions 50 without the interposition of gold foil 51. Thus, second electrode 61 is electrically connected to the negative electrode, which is the upper surface of semiconductor laser element 40.

Furthermore, wiring can be attached to first electrode 60 and second electrode 61 with bolts 80 and 81, respectively, as shown in FIG. 1.

Figure 2:
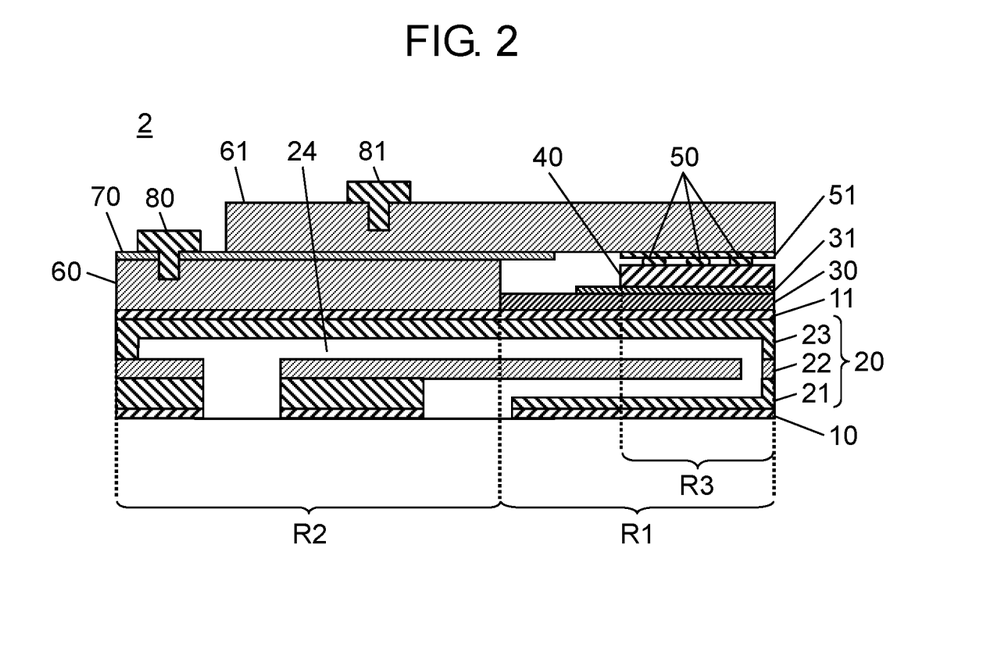
FIG. 2 is a schematic sectional view of semiconductor laser device 2 according to the exemplary embodiment.

In semiconductor laser device 2 shown in FIG. 2, first electrode 60 is in direct contact with part of a side surface of submount 30 and is not in direct contact with the fourth region.

Figure 3:
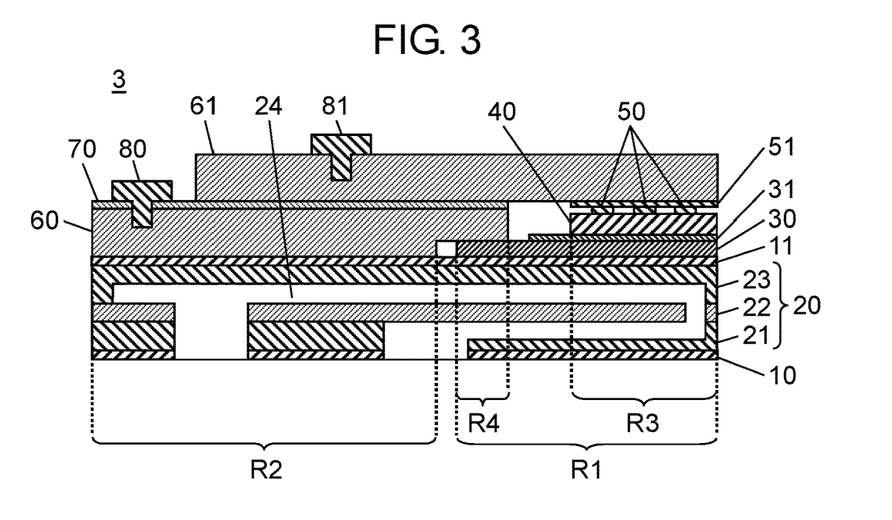
FIG. 3 is a schematic sectional view of semiconductor laser device 3 according to the exemplary embodiment.

In semiconductor laser device 3 shown in FIG. 3, first electrode 60 is in direct contact with the fourth region RA of the upper surface of submount 30 and is not in direct contact with the side surface of submount 30.

Figure 4:
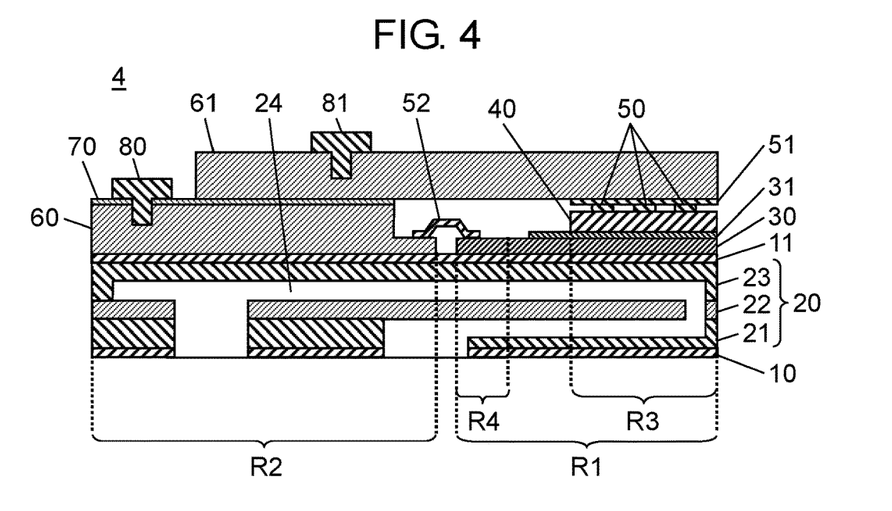
FIG. 4 is a schematic sectional view of semiconductor laser device 4 according to the exemplary embodiment.

In semiconductor laser device 4 shown in FIG. 4, first electrode 60 is electrically connected to the fourth region RA of the upper surface of the submount via wiring material 52. Wiring material 52 can be, for example, a plate spring made of copper.

Semiconductor laser devices 1-4 are effective to reduce connection resistance, and device 1 is more effective than the others. In devices 2, 3, and 4, the same components as in device 1 are denoted by the same reference numerals, and thus a detailed description thereof may be omitted.

In the exemplary embodiment, the term "in direct contact" may indicate a state in which two components are in contact with each other via a thin conductive layer or film. Meanwhile, the term "not in direct contact" may indicate a state in which two components are in contact with each other via an insulating member other than a conductive layer or film.

As described so far, in semiconductor laser device 1 according to the exemplary embodiment, first electrode 60 is electrically connected to one or both of part of a side surface of submount 30 and the fourth region RA. This arrangement greatly reduces the electrical resistance of the current paths and allows semiconductor laser device 1 to provide high laser output.

Methods for manufacturing semiconductor laser devices 1 to 4 according to the exemplary embodiment will now be described with reference to FIGS. 5 to 14. The following order of processes is an example and does not limit the methods for manufacturing the semiconductor laser devices.

FIGS. 5 to 14 are sectional views showing methods for manufacturing semiconductor laser devices according to the exemplary embodiment. The same components as in FIG. 1 are denoted by the same reference numerals and thus a detailed description thereof will be omitted.

Figure 5:
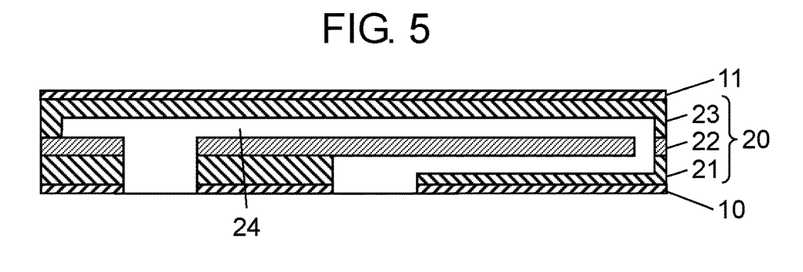
FIG. 5 is a sectional view showing a step of a method for manufacturing semiconductor laser device 1 according to the exemplary embodiment.

As shown in FIG. 5, insulating plates 21-23 are laminated together to define heat sink 20 including flow channel 24 for a coolant. Next, copper layer 11 is put on the upper surface of heat sink 20, and copper layer 10 is put on the lower surface of heat sink 20. These copper layers 10 and 11 are formed by pasting a copper film, but they are not essential components of devices 1 to 4.

Figure 6:
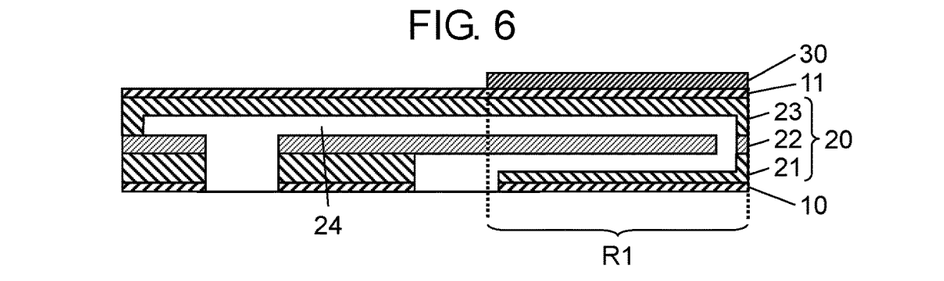
FIG. 6 is a sectional view showing a step of the method for manufacturing semiconductor laser device 1 according to the exemplary embodiment.

Next, as shown in FIG. 6, conductive submount 30 is put on the first region R1 of the upper surface of heat sink 20 (first step). At this moment, if copper layer 11 is present, heat sink 20 and submount 30 are coupled via copper layer 11.

Figure 7:
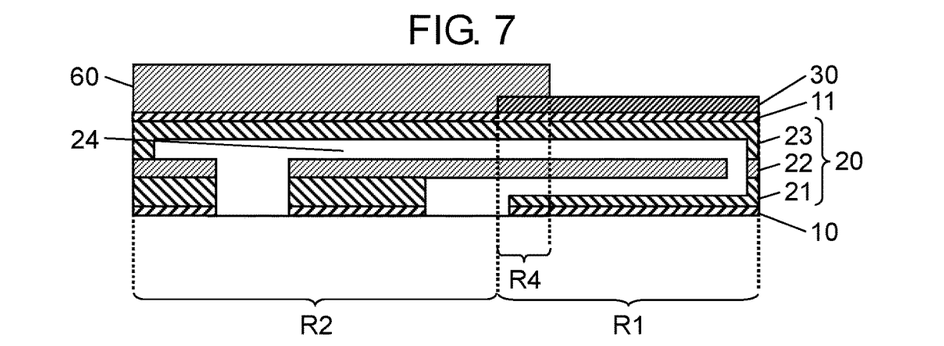
FIG. 7 is a sectional view showing a step of the method for manufacturing semiconductor laser device 1 according to the exemplary embodiment.

Next, as shown in FIG. 7, conductive first electrode 60 is put on the second region R2, different of the first region R1, of the upper surface of heat sink 20 (second step). At this moment, if copper layer 11 is present, heat sink 20 and first electrode 60 are coupled via copper layer 11. In this case, first electrode 60 is put in such a manner as to be electrically connected to part of a side surface of submount 30 and to the fourth region RA of the upper surface of submount 30. In other words, first electrode 60 is put in such a manner as to be in direct contact with the part of the side surface of submount 30 and with the fourth region RA of the upper surface of submount 30.

Figure 8:
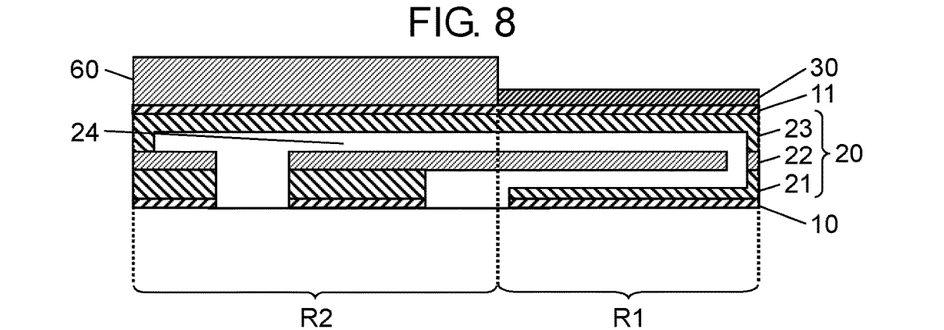
FIG. 8 is a sectional view showing a step of a method for manufacturing semiconductor laser device 2 according to the exemplary embodiment.

In this case, as shown in FIG. 8, first electrode 60 can be put in such a manner as to be in direct contact with only part of the side surface of submount 30 to achieve semiconductor laser device 2 shown in FIG. 2 as the end product.

Figure 9:
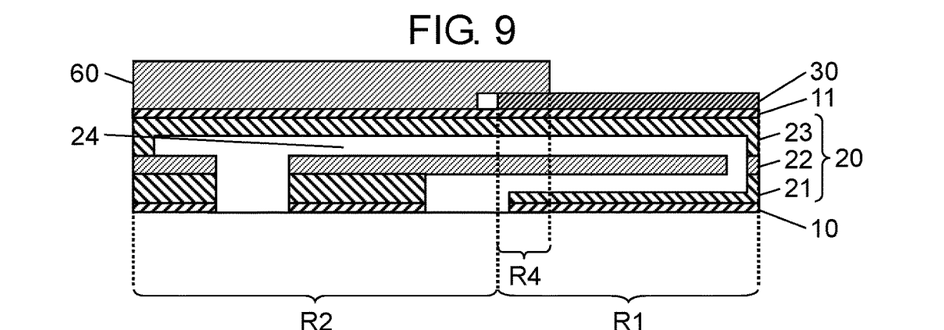
FIG. 9 is a sectional view showing a step of a method for manufacturing semiconductor laser device 3 according to the exemplary embodiment.

Alternatively, first electrode 60 can be put in direct contact with only the fourth region RA of the upper surface of submount 30 as shown in FIG. 9 to achieve semiconductor laser device 3 shown in FIG. 3 as the end product.

Figure 10:
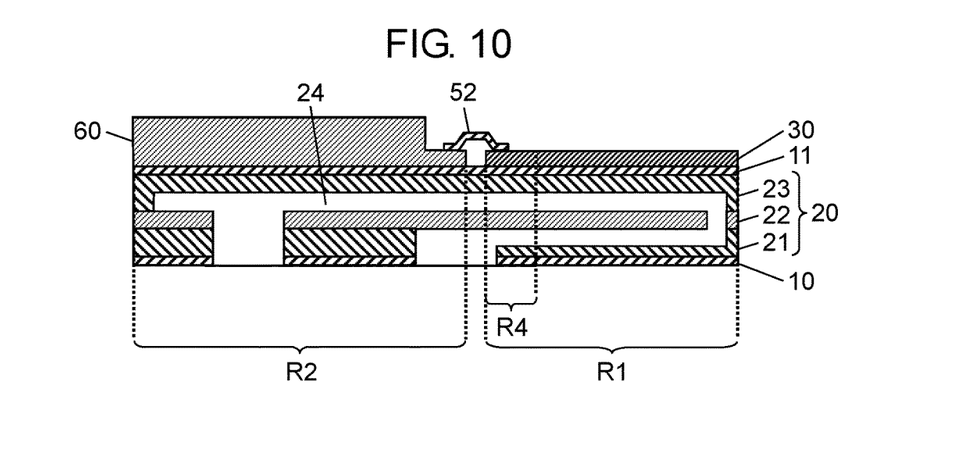
FIG. 10 is a sectional view showing a step of a method for manufacturing semiconductor laser device 4 according to the exemplary embodiment.

Still alternatively, first electrode 60 can be electrically connected to fourth region RA of the upper surface of submount 30 via wiring material 52 as shown in FIG. 10 to achieve semiconductor laser device 4 shown in FIG. 4.

The following description takes semiconductor laser device 1 as an example.

Figure 11:
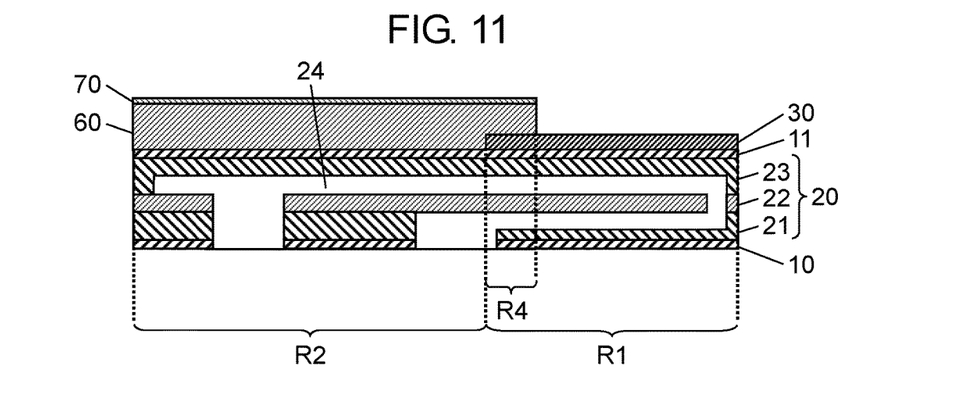
FIG. 11 is a sectional view showing a step of the method for manufacturing semiconductor laser device 1 according to the exemplary embodiment.

As shown in FIG. 11, insulating layer 70 is put on first electrode 60 (third step). One approach to forming insulating layer 70 is to paste a thermally-conductive insulating sheet onto first electrode 60.

Figure 12:
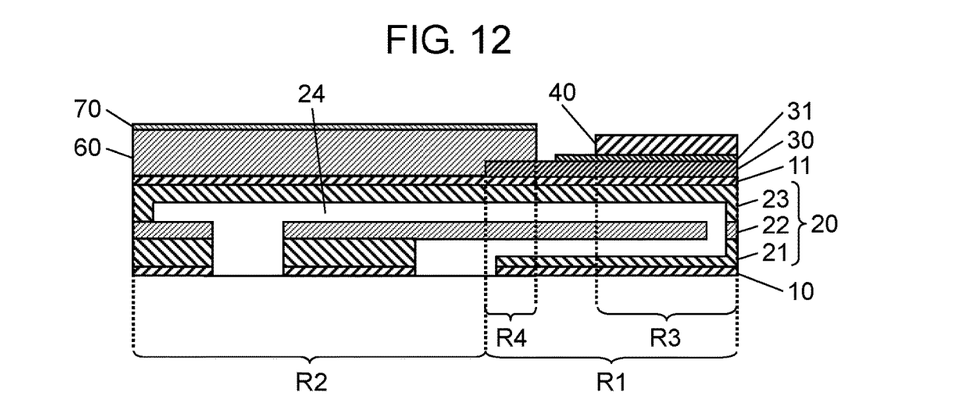
FIG. 12 is a sectional view showing a step of the method for manufacturing semiconductor laser device 1 according to the exemplary embodiment.

Next, as shown in FIG. 12, semiconductor laser element 40 for outputting laser light is put on the third region R3 of the upper surface of submount 30 (fourth step). In this case, gold-tin layer 31 may be deposited on a region larger than the third region R3 before putting semiconductor laser element 40.

Figure 13:
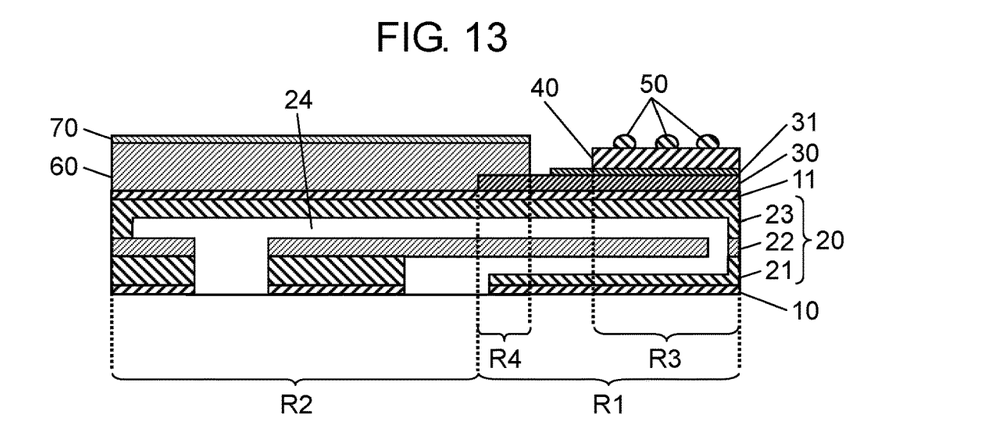
FIG. 13 is a sectional view showing a step of the method for manufacturing semiconductor laser device 1 according to the exemplary embodiment.

Next, as shown in FIG. 13, conductive connecting portions 50 are put onto semiconductor laser element 40 (fifth step). One approach to forming connecting portions 50 is to melt gold wire. The number of connecting portions 50 can be arbitrarily determined depending on the size of connecting portions 50 or the size of semiconductor laser element 40.

Figure 14:
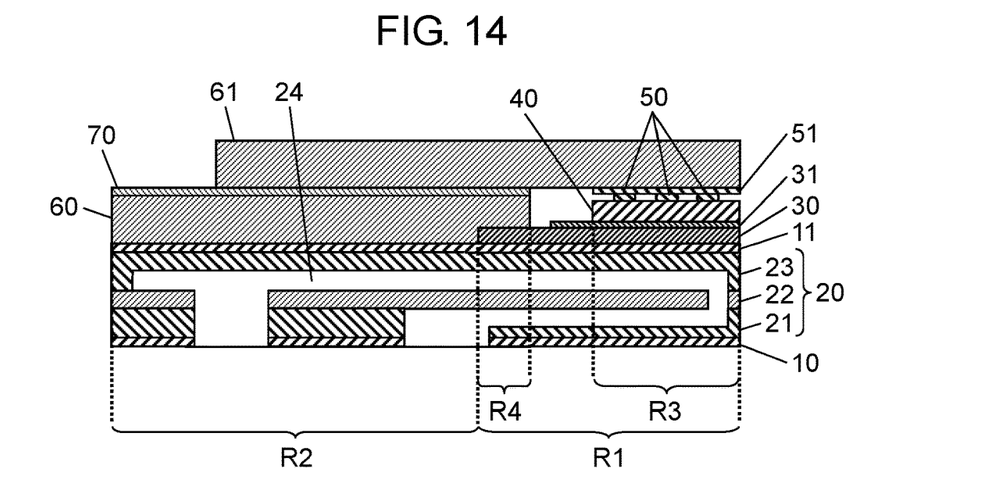
FIG. 14 is a sectional view showing a step of the method for manufacturing semiconductor laser device 1 according to the exemplary embodiment.

Next, as shown in FIG. 14, conductive second electrode 61 is put on insulating layer 70 and connecting portions 50 (sixth step). In this case, gold foil 51 may be put on connecting portions 50 before putting second electrode 61.

Finally, wiring can be attached to first electrode 60 and second electrode 61 with bolts 80 and 81, respectively, thereby completing semiconductor laser device 1 shown in FIG. 1.

In the above-described method for manufacturing the semiconductor laser device according to the exemplary embodiment, first electrode 60 is electrically connected to one or both of part of a side surface of submount 30 and the fourth region RA. This greatly decreases the electrical resistance of the current paths, thereby providing high-output semiconductor laser device 1.

First electrode 60 is connected only to part of the side surface of submount 30 in the exemplary embodiment, but may alternatively be connected to the entire side surface of submount 30.

When conductive members are connected together, a conductive thin metal or film may be used as an adhesive in the exemplary embodiment. In this case, the conductive members are expressed as being "in direct contact" with each other.

INDUSTRIAL APPLICABILITY

In the semiconductor laser device and the method for manufacturing the device according to the present disclosure, the semiconductor laser element is supplied with a large current to greatly reduce the electrical resistance of the current paths and to provide high laser output. Therefore, the semiconductor laser device and the method for manufacturing the device according to the present disclosure are industrially useful.

REFERENCE MARKS IN THE DRAWINGS 1, 2, 3, 4 semiconductor laser device
10 copper layer
11 copper layer (first conductive layer)
20 heat sink
21-23 insulating plate
24 flow channel
30 submount
31 gold-tin layer (second conductive layer)
40 semiconductor laser element
50 connecting portion
51 gold foil (third conductive layer)
52 wiring
60 first electrode
61 second electrode
70 insulating layer
80, 81 bolt
900 laser diode
901 upper electrode
902 insulating member
903 LD chip
904, 905 submount
906 heat sink
907 wire
R1 first region
R2 second region
R3 third region
R4 fourth region

The invention claimed is:

1. A semiconductor laser device comprising:
   an insulating heat sink including a flow channel for a coolant;
   a conductive submount on a first region of an upper surface of the insulating heat sink;
   a conductive first electrode on a same plane as the conductive submount, wherein a region of the upper surface of the insulating heat sink where the conductive first electrode is positioned includes a second region different from the first region;
   an insulating layer on the conductive first electrode;
   a semiconductor laser element on a third region of an upper surface of the conductive submount, the semiconductor laser element being configured to output laser light;
   a conductive connecting portion on the semiconductor laser element; and
   a conductive second electrode on the insulating layer and the conductive connecting portion,
   wherein the conductive first electrode is electrically connected either to at least part of a side surface of the conductive submount or to a fourth region, different from the third region, of the upper surface of the conductive submount.

2. The semiconductor laser device according to claim 1, further comprising a first conductive layer on the upper surface of the insulating heat sink,
   wherein the conductive first electrode and the conductive submount are in direct contact with the first conductive layer.

3. The semiconductor laser device according to claim 1, further comprising a second conductive layer on the third region of the upper surface of the conductive submount,
   wherein the semiconductor laser element is in direct contact with the second conductive layer.

4. The semiconductor laser device according to claim 1, further comprising a third conductive layer between the conductive connecting portion and the conductive second electrode,
   wherein the conductive connecting portion and the conductive second electrode are in direct contact with the third conductive layer.

5. The semiconductor laser device according to claim 1, wherein the conductive first electrode is in direct contact with the part of the side surface of the conductive submount and with the fourth region so as to be electrically connected to the conductive submount.

6. The semiconductor laser device according to claim 1, wherein the conductive first electrode is in direct contact with the part of the side surface of the conductive submount so as to be electrically connected to the conductive submount and not to be in direct contact with the fourth region.

7. The semiconductor laser device according to claim 1, wherein the conductive first electrode is in direct contact with the fourth region so as to be electrically connected to the conductive submount and not to be in direct contact with the side surface of the conductive submount.

8. The semiconductor laser device according to claim 1, wherein the conductive first electrode is electrically connected to the fourth region via a wiring material.

9. A method of manufacturing a semiconductor laser device, the method comprising:
   a first step of putting a conductive submount onto a first region of an upper surface of an insulating heat sink including a flow channel for a coolant;
   a second step of putting a conductive first electrode onto a same plane as the conductive submount, wherein a region of the upper surface of the insulating heat sink where the conductive first electrode is positioned includes a second region different from the first region;
   a third step of putting an insulating layer onto the conductive first electrode;
   a fourth step of putting a semiconductor laser element onto a third region of an upper surface of the conductive submount, the semiconductor laser element being configured to output laser light;
   a fifth step of putting a conductive connecting portion onto the semiconductor laser element; and
   a sixth step of putting a conductive second electrode onto the insulating layer and the conductive connecting portion,
   wherein, in the second step, the conductive first electrode is electrically connected either to at least part of a side surface of the conductive submount or to a fourth region, different from the third region, of the upper surface of the conductive submount.

* * * * *